United States Patent
Yan et al.

(10) Patent No.: US 11,937,481 B2
(45) Date of Patent: Mar. 19, 2024

(54) DISPLAY SUBSTRATE, MANUFACTURING METHOD THEREOF, AND DISPLAY DEVICE

(71) Applicant: BOE TECHNOLOGY GROUP CO., LTD., Beijing (CN)

(72) Inventors: Guang Yan, Beijing (CN); Changyen Wu, Beijing (CN); Linlin Wang, Beijing (CN); Yongqi Shen, Beijing (CN); Juanjuan You, Beijing (CN); Li Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 681 days.

(21) Appl. No.: 15/734,826

(22) PCT Filed: Apr. 9, 2020

(86) PCT No.: PCT/CN2020/083956
§ 371 (c)(1),
(2) Date: Dec. 3, 2020

(87) PCT Pub. No.: WO2020/207433
PCT Pub. Date: Oct. 15, 2020

(65) Prior Publication Data
US 2021/0233964 A1    Jul. 29, 2021

(30) Foreign Application Priority Data

Apr. 9, 2019    (CN) .......................... 201910280078.6

(51) Int. Cl.
*H10K 59/38* (2023.01)
*H10K 50/86* (2023.01)
(Continued)

(52) U.S. Cl.
CPC .......... *H10K 59/38* (2023.02); *H10K 50/865* (2023.02); *H10K 59/121* (2023.02); *H10K 71/00* (2023.02)

(58) Field of Classification Search
CPC ..... H10K 59/38; H10K 59/151; H10K 50/865
See application file for complete search history.

(56) References Cited

U.S. PATENT DOCUMENTS

2012/0097954 A1* 4/2012 Choi .................... H10K 59/351
                                                         257/59
2013/0161595 A1* 6/2013 Kim ..................... H10K 59/352
                                                         257/89
(Continued)

FOREIGN PATENT DOCUMENTS

| CN | 103329625 A | 9/2013 |
|---|---|---|
| CN | 104282719 A | 1/2015 |

(Continued)

OTHER PUBLICATIONS

International Search Report and Written Opinion for Application No. PCT/CN2020/083956, dated Jul. 7, 2020, 11 Pages.
(Continued)

*Primary Examiner* — Mark W Tornow
(74) *Attorney, Agent, or Firm* — BROOKS KUSHMAN P.C.

(57) ABSTRACT

A display substrate, a manufacturing method thereof, and a display device are provided. The display substrate includes a base substrate and a white OLED display unit on the base substrate, and further includes: an optical adjustment structure on a light emitting side of the white OLED display unit, where the optical adjustment structure is in a peripheral region of each pixel region. The optical adjustment structure
(Continued)

is configured to absorb light in a first wavelength range or convert light in a first wavelength range into light in a second wavelength range.

18 Claims, 1 Drawing Sheet

(51) Int. Cl.
*H10K 59/121* (2023.01)
*H10K 71/00* (2023.01)

(56) References Cited

U.S. PATENT DOCUMENTS

| | | | |
|---|---|---|---|
| 2013/0299808 | A1 | 11/2013 | Sugimoto et al. |
| 2015/0008403 | A1 | 1/2015 | Kudo et al. |
| 2015/0090985 | A1 | 4/2015 | Park et al. |
| 2016/0035795 | A1 | 2/2016 | Lim et al. |
| 2016/0155976 | A1 | 6/2016 | Kim et al. |
| 2017/0146854 | A1 | 5/2017 | Cui |
| 2017/0194381 | A1 | 7/2017 | Hsu |
| 2018/0026087 | A1 | 1/2018 | Lee et al. |
| 2018/0122874 | A1 | 5/2018 | Kim et al. |
| 2019/0043931 | A1 | 2/2019 | Yim et al. |
| 2019/0067381 | A1* | 2/2019 | Kim ................ H10K 59/38 |
| 2019/0067383 | A1* | 2/2019 | Jo ................ H10K 59/1213 |
| 2019/0363270 | A1 | 11/2019 | Wang et al. |
| 2020/0176516 | A1 | 6/2020 | Yan et al. |
| 2021/0098739 | A1 | 4/2021 | Yu et al. |

FOREIGN PATENT DOCUMENTS

| | | |
|---|---|---|
| CN | 104518001 A | 4/2015 |
| CN | 104851903 A | 8/2015 |
| CN | 104880848 A | 9/2015 |
| CN | 105470285 A | 4/2016 |
| CN | 105655372 A | 6/2016 |
| CN | 107393950 A | 11/2017 |
| CN | 108022959 A | 5/2018 |
| CN | 108461524 A | 8/2018 |
| CN | 108717941 A | 10/2018 |
| CN | 109390375 A | 2/2019 |
| CN | 109524442 A | 3/2019 |
| CN | 109873024 A | 6/2019 |

OTHER PUBLICATIONS

First Office Action for Chinese Application No. 201910280078.6, dated Jul. 13, 2020, 2017, 7 Pages.
Second Office Action for Chinese Application No. 201910280078.6, dated Feb. 2, 2021, 2017, 4 Pages.

* cited by examiner

DISPLAY SUBSTRATE, MANUFACTURING METHOD THEREOF, AND DISPLAY DEVICE

CROSS-REFERENCE TO RELATED APPLICATION APPLICATIONS

This application is the U.S. national phase of PCT Application No. PCT/CN2024/083956 filed on Apr. 9, 2020, which claims priority to Chinese Patent Application No. 201910280078.6 filed on Apr. 9, 2019, which are incorporated herein by reference in their entireties.

TECHNICAL FIELD

The present disclosure relates to the field of display technology, and in particular to a display substrate, a manufacturing method thereof, and a display device.

BACKGROUND

The display technology of white OLED (organic light-emitting diode) plus color film is currently the most mature solution of OLED process. However, white OLED display products in the related technologies still have aspects to be improved.

SUMMARY

In an aspect, some embodiments of the present disclosure provide a display substrate, including:
  a base substrate;
  a white organic light-emitting diode (OLED) display unit on the base substrate; and
  an optical adjustment structure on a light emitting side of the white OLED display unit, where the optical adjustment structure is in a peripheral region of each pixel region, and the optical adjustment structure is configured to absorb light in a first wavelength range or convert light in a first wavelength range into light in a second wavelength range.

In some embodiments of the present disclosure, the pixel region further includes a central region, the peripheral region surrounds the central region, and the optical adjustment structure is symmetrical with respect to the central region.

In some embodiments of the present disclosure, the display substrate further includes:
  an auxiliary structure in a same layer as the optical adjustment structure, where the auxiliary structure and the optical adjustment structure form a flat layer.

In some embodiments of the present disclosure, the display substrate further includes:
  an auxiliary structure covering the optical adjustment structure, where the auxiliary structure has a flat surface.

In some embodiments of the present disclosure, the auxiliary structure is made of a light-transmissive material.

In some embodiments of the present disclosure, an angle, between a line connecting a first edge of the optical adjustment structure and a center of the white OLED display unit and a normal line perpendicular to the base substrate, is greater than a threshold, and the first edge is an edge closer to the center of the white OLED display unit.

In some embodiments of the present disclosure, the threshold ranges from 45 degrees to 60 degrees.

In some embodiments of the present disclosure, the optical adjustment structure is configured to absorb green light, or, convert green light into red light or blue light.

In some embodiments of the present disclosure, the optical adjustment structure includes a red filter layer and a blue filter layer that are stacked.

In some embodiments of the present disclosure, the optical adjustment structure includes at least one of: a photonic crystal, a color conversion structure, or a filter structure.

Some embodiments of the present disclosure also provide a display device, including the display substrate described above.

Some embodiments of the present disclosure also provide a method for manufacturing a display substrate, including:
  forming an optical adjustment structure on a light emitting side of a white OLED display unit, where the optical adjustment structure is in a peripheral region of each pixel region, and the optical adjustment structure is configured to absorb light in a first wavelength range or convert light in a first wavelength range into light in a second wavelength range.

In some embodiments of the present disclosure, the optical adjustment structure is symmetrical with respect to a central region of the pixel region, and the peripheral region of the pixel region surrounds the central region.

In some embodiments of the present disclosure, the method further includes:
  forming an auxiliary structure in a same layer as the optical adjustment structure, where the auxiliary structure and the optical adjustment structure form a flat layer.

In some embodiments of the present disclosure, the method further includes:
  forming an auxiliary structure covering the optical adjustment structure, where the auxiliary structure has a flat surface.

In some embodiments of the present disclosure, the forming the auxiliary structure includes forming the auxiliary structure with a light-transmissive material.

In some embodiments of the present disclosure, the forming the optical adjustment structure includes:
  forming a red filter layer and a blue filter layer that are stacked.

In some embodiments of the present disclosure, the method further includes:
  the method further includes: providing a base substrate, where the white OLED display unit is arranged on the base substrate.

BRIEF DESCRIPTION OF THE DRAWINGS

To better clarify technical solutions of embodiments of the present disclosure, drawings used in description of the embodiments are briefly introduced hereinafter. Apparently, the described drawings merely illustrate a part of the disclosed embodiments. A person ordinary skilled in the art can obtain other drawings based on the described drawings without any creative efforts.

DETAILED DESCRIPTION

Figure 1:
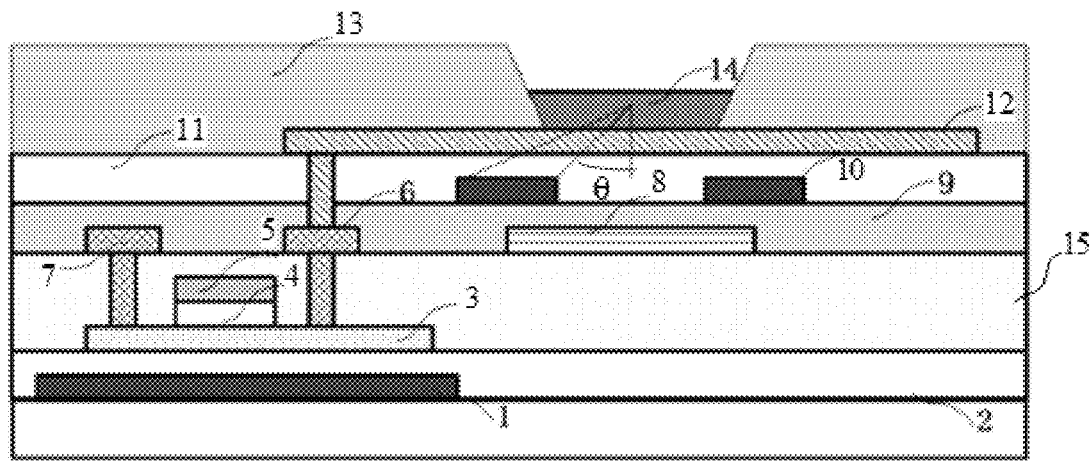
FIG. 1 is a schematic structural diagram of a display substrate according to some embodiments of the disclosure.

In order to facilitate understanding of technical problems to be solved, technical solutions and advantages of embodiments of the present disclosure, detailed descriptions are provided hereinafter with reference to the accompanying drawings and specific embodiments.

In related technologies, a light emitting layer of a white OLED display product is formed by red, green and blue light-emitting materials which are stacked. The red and green light-emitting materials are mostly phosphor materials, and the blue light-emitting material is generally a fluorescent material. The phosphor material has a wide spectrum and high luminous efficiency, while the fluorescent material has a narrow spectrum and low luminous efficiency. Therefore, in a case of a side view angle, intensities at various wavelength ranges of light emitted by the white OLED display product decrease at different speeds, resulting in change of light color and resulting in color shift at the side view angle, and then affecting viewing experience of a user.

Table 1 shows color coordinates (CIEx, CIEy) and color shift coefficients (Δu'v') at different view angles. It can be seen that in a case that the view angle is greater than 45 degrees (°), there is a serious color shift problem.

TABLE 1

| | W | | |
|---|---|---|---|
| View angle | CIEx | CIEy | Δu'v' |
| 0 | 0.320 | 0.307 | — |
| 15 | 0.321 | 0.314 | 0.004 |
| 30 | 0.323 | 0.336 | 0.019 |
| 45 | 0.323 | 0.370 | 0.040 |
| 60 | 0.322 | 0.400 | 0.056 |

In view of the above problem, embodiments of the present disclosure provide a display substrate, a manufacturing method thereof, and a display device, which can improve the color shift at the side view angle of the display device and improve the display effect of the display device.

Some embodiments of the present disclosure provide a display substrate, including a base substrate and a white OLED display unit arrange on the base substrate. The display substrate further includes:

an optical adjustment structure located on a light emitting side of the white OLED display unit, where the optical adjustment structure is arranged in a peripheral region of each pixel region, the peripheral region surrounds a central region of the pixel region, and the optical adjustment structure is capable of absorbing light with a specific wavelength or converting light with a specific wavelength into light with another wavelength.

In the embodiments of the present disclosure, the display substrate includes the optical adjustment structure located on the light emitting side of the white OLED display unit, the optical adjustment structure is arranged in the peripheral region of each pixel region, and the optical adjustment structure can absorb light having a specific wavelength or convert light having a specific wavelength into light having another wavelength. In this way, when color shift of a specific wavelength occurs at a side view angle, the optical adjustment structure can absorb light having the specific wavelength or convert light having the specific wavelength into light having another wavelength, thereby improving color shift of the display device at the side view angle and improving the display effect of the display device.

Some embodiments of the present disclosure provide a display substrate, including:
a base substrate
a white OLED display unit on the base substrate; and
an optical adjustment structure on a light emitting side of the white OLED display unit, where the optical adjustment structure is in a peripheral region of each pixel region, and the optical adjustment structure is configured to absorb light in a first wavelength range or convert light in a first wavelength range into light in a second wavelength range.

Specifically, a testing substrate may be tested in advance. Parameters of each functional film of the test substrate are the same as parameters of each functional film of the display substrate to be manufactured. It is determined color shift of which color may occur in the display substrate, and material used by the optical adjustment structure is determined based on the determination result. For example, when it is determined that the display substrate may have a green color shift at a side view angle, the optical adjustment structure may be designed. For example, a red filter material and a blue filter material may be used to form the optical adjustment structure, so that the optical adjustment structure can absorb green light. When it is determined that the display substrate may have a red color shift at a side view angle, the optical adjustment structure may be designed. For example, a green filter material and a blue filter material may be used to form the optical adjustment structure, so that the optical adjustment structure can absorb red light. When it is determined that the display substrate may have a blue color shift at a side view angle, the optical adjustment structure may be designed. For example, a red filter material and a green filter material may be used to form the optical adjustment structure, so that the optical adjustment structure can absorb blue light; or, a red quantum dot material and a green quantum dot material may be used to form the optical adjustment structure, so that the optical adjustment structure can convert blue light into red light and green light.

In some embodiments of the present disclosure, the light in the first wavelength range may be green light, and the light in the second wavelength range may be red light and/or blue light; or, the light in the first wavelength range may be red light, and the light in the second wavelength range may be blue light and/or green light; or, the light in the first wavelength range may be blue light, and the light in the second wavelength range may be red light and/or green light.

The first wavelength range and the second wavelength range may be determined based on display characteristics of the display substrate (such as color shift at a side view angle). For example, when the display substrate has a green color shift at the side view angle, the light in the first wavelength range may be green light; in this case, the optical adjustment structure may be arranged to absorb green light or convert green light into red light and/or blue light. The green, red, or blue color shift at the side view angle is taken as an example for description and illustration; however, the present disclosure is not limited thereto. In practical applications, for other color shifts, values of the first wavelength range and the second wavelength range may be adjusted to improve the color shift.

Taking a case of green color shift as an example, the first wavelength range may specifically be 510 nm to 530 nm, that is, the optical adjustment structure may absorb green light. In some examples, the optical structure may convert light in the range of 510 nm to 530 nm into light in a range of such as 620 nm to 640 nm, that is, the optical adjustment structure may convert green light into red light. The wavelength ranges listed herein are only for illustration. In practical applications, values of wavelength ranges of various colors may be determined based on factors such as light emitting characteristics of the OLED display unit and the color shift of the display substrate.

In some embodiments of the present disclosure, the display substrate further includes:

an auxiliary structure in a same layer as the optical adjustment structure, where the auxiliary structure and the optical adjustment structure form a flat layer; or an auxiliary structure covering the optical adjustment structure, where the auxiliary structure has a flat surface. In this way, the combination of the auxiliary structure and the optical adjustment structure can provide a flat surface for a subsequent process. The auxiliary structure may be made of a light-transmissive material. Specifically, it may be made of an insulating material having high transparency, such as a transparent resin.

In some embodiments of the present disclosure, an angle, between a line connecting an edge of the optical adjustment structure closer to a center of the white OLED display unit and the center and a normal line perpendicular to the base substrate, is greater than a threshold. Since relatively obvious color shift merely occurs at side view angles and the optical adjustment structure may have a certain impact on the light emitting efficiency of the display substrate, the optical adjustment structure may not be provided for the central region of the white OLED display unit and the optical adjustment structure may only be provided for the edge region of the white OLED display unit, which can not only solve the color shift problem existing at the side view angle, but also will not cause much influence on the light emitting efficiency of the display substrate.

Since there is a serious color shift problem when the view angle is greater than 45°, the range of the threshold may be 450 to 600 (inclusively). The embodiments of the present disclosure are described by taking a case where a serious color shift occurs when the view angle is greater than 450 as an example, but the present disclosure is not limited thereto. In practical applications, the angle at which there is a serious color shift may be determined according to the actual display effect. When the angle at which the relatively serious color shift occurs is not a view angle greater than 45°, the threshold may be adjusted accordingly.

In some embodiments of the present disclosure, as shown in FIG. 1, the angle θ, between a line connecting a first edge of the optical adjustment structure 10 and a center of the white OLED display unit 14 and a normal line perpendicular to the base substrate, may be greater than a preset threshold (for example, 45°). The first edge is an edge close to the center of the white OLED display unit 14. In addition, in some embodiments, the optical adjustment structure is symmetrically arranged with respect to the central region of the white OLED display unit 14, that is, the left part of optical adjustment structures 10 and the right part of optical adjustment structures 10 shown in the figure have the same distance from the center of the white OLED display unit 14.

When the view angle is greater than 45°, the rate of decrease of the intensity of the green light band is significantly less than the rate of decrease of the intensity of the red and blue light bands. Therefore, the display screen seen at the side view angle is greenish, so the optical adjustment structure is configured to absorb green light; or convert green light into red or blue light.

Specifically, the optical adjustment structure includes a red filter layer and a blue filter layer that are stacked, so that the optical adjustment structure can absorb green light and does not affect the emission of red light and blue light substantially.

In white OLED display products, the emission spectrum of white organic light-emitting diode elements includes at least two (blue and yellow) or three (blue, green and red) center wavelengths of visible light. The optical adjustment structure is provided in the optical path of the specific side view angle range (determined by the optical characteristics of the white organic light-emitting diode element) of the white organic light-emitting diode element. The optical characteristics of the optical adjustment structure are matched with and set according to the optical characteristics of the white organic light-emitting diode element; the optical adjustment structure may be independently arranged, and an auxiliary structure may be provided on the same layer as the optical adjustment structure. The auxiliary structure may be a transparent non-functional film, which may form a flat layer with the optical adjustment structure.

The optical characteristics of the optical adjustment structure being matched with and set according to the optical characteristics of the white organic light-emitting diode element refers to that: for a waveband where the white organic light-emitting diode element is relatively enhanced at the side view angle, the optical adjustment structure has a lower transmittance in this waveband than other wavebands, and/or can enhance transmittance of another waveband(s), and/or can convert the light in this waveband into light of another waveband(s).

The optical adjustment structure may use at least one of: a photonic crystal, a color conversion structure, or a filter structure. The color conversion structure may be, for example, a color conversion film, specifically, such as a color conversion film containing fluorescent substance. The filter structure may be, for example, a color filter layer, specifically, such as a red filter layer and a blue filter layer that are stacked. For common TV applications and panel designs, the long side of the pixel is perpendicular to the ground, and the optical adjustment structure may be arranged in some regions on the left and right sides of the pixel, such as a region corresponding to a specific angle (for example, greater than 45°) where the equivalent light is emitted.

Some embodiments of the present disclosure also provide a display device, including the above display substrate. The display device may be any product or component with a display function such as a TV, a display, a digital photo frame, a mobile phone, a tablet computer, etc. The display device may also include a flexible circuit board, a printed circuit board and a backplane.

Some embodiments of the present disclosure provide a method for manufacturing a display substrate. The method may be used to manufacture the display substrate described in the above embodiments. The method includes:

forming an optical adjustment structure on a light emitting side of a white OLED display unit, where the optical adjustment structure is arranged in a peripheral region of each pixel region, the peripheral region surrounds a central region of the pixel region, and the optical adjustment structure can absorb light with a specific wavelength or convert light with a specific wavelength into light with another wavelength.

In the embodiments of the present disclosure, the display substrate includes the optical adjustment structure located on the light emitting side of the white OLED display unit, the optical adjustment structure is arranged in the peripheral region of each pixel region, and the optical adjustment structure can absorb light of the specific wavelength or convert light of the specific wavelength into light of another wavelength. In this way, when a color shift of a specific wavelength occurs at the side view angle, the optical adjustment structure can absorb or convert light with the specific wavelength into light with other wavelength(s), thereby improving the color shift at the side view angle of the display device and improving the display effect of the display device.

Some embodiments of the present disclosure provide a method for manufacturing a display substrate, including:

forming an optical adjustment structure on a light emitting side of a white OLED display unit, where the optical adjustment structure is in a peripheral region of each pixel region, and the optical adjustment structure is configured to absorb light in a first wavelength range or convert light in a first wavelength range into light in a second wavelength range.

In some embodiments, the optical adjustment structure is symmetrically arranged with respect to a central region of the pixel region, and the peripheral region of the pixel region surrounds the central region.

Specifically, a testing substrate may be tested in advance. Parameters of each functional film of the test substrate are the same as parameters of each functional film of the display substrate to be manufactured. It is determined color shift of which color may occur in the display substrate, and material used by the optical adjustment structure is determined based on the determination result. For example, when it is determined that the display substrate may have a green color shift at a side view angle, the optical adjustment structure may be designed. For example, a red filter material and a blue filter material may be used to form the optical adjustment structure, so that the optical adjustment structure can absorb green light. When it is determined that the display substrate may have a red color shift at a side view angle, the optical adjustment structure may be designed. For example, a green filter material and a blue filter material may be used to form the optical adjustment structure, so that the optical adjustment structure can absorb red light. When it is determined that the display substrate may have a blue color shift at a side view angle, the optical adjustment structure may be designed. For example, a red filter material and a green filter material may be used to form the optical adjustment structure, so that the optical adjustment structure can absorb blue light; or, a red quantum dot material and a green quantum dot material may be used to form the optical adjustment structure, so that the optical adjustment structure can convert blue light into red light and green light.

In some embodiments of the present disclosure, the method further includes:

forming an auxiliary structure in a same layer as the optical adjustment structure, where the auxiliary structure and the optical adjustment structure form a flat layer; or, forming an auxiliary structure covering the optical adjustment structure, where the auxiliary structure has a flat surface. In this way, the combination of the auxiliary structure and the optical adjustment structure can provide a flat surface for a subsequent process. The auxiliary structure may be made of a light-transmissive material. Specifically, it may be made of an insulating material having high transparency, such as a transparent resin.

When the view angle is greater than 45°, the rate of decrease of the intensity of the green light band is significantly less than the rate of decrease of the intensity of the red and blue light bands. Therefore, the display screen seen at the side view angle is greenish, so the optical adjustment structure is configured to absorb green light; or convert green light into red or blue light.

Specifically, the optical adjustment structure includes a red filter layer and a blue filter layer that are stacked, so that the optical adjustment structure can absorb green light and does not affect the emission of red light and blue light substantially. In some embodiments of the present disclosure, forming the optical adjustment structure includes:

forming a red filter layer and a blue filter layer that are stacked.

In some embodiments, before forming the optical adjustment structure, the method further includes:

providing a base substrate, where the white OLED display unit is arranged on the base substrate.

The technical solutions of the present disclosure are further described hereinafter in conjunction with the drawings and specific embodiments.

In the embodiments of the present disclosure, the display substrate may be a bottom-emitting OLED display substrate, and the optical adjustment structure is arranged between a passivation layer and an anode. In some embodiments of the present disclosure, the method for manufacturing the display substrate may include the following steps.

Step 1 includes: providing a base substrate, and forming a light shielding layer 1 on the base substrate.

The base substrate may be a glass substrate or a quartz substrate. Sputtering or thermal evaporation may be used to deposit a metal layer on the base substrate, a layer of photoresist is coated on the metal layer, and a mask is used to expose the photoresist to form a photoresist unreserved region and a photoresist reserved region. The photoresist reserved region corresponds to the region where the pattern of the light shielding layer 1 is located, and the photoresist unreserved region corresponds to the region except the above pattern. Developing is performed, the photoresist in the photoresist unreserved region is completely removed, and the thickness of the photoresist in the photoresist reserved region remains unchanged. The metal film in the photoresist unreserved region is completely etched by the etching process, and the remaining photoresist is stripped, to form the light shielding layer 1.

Step 2 includes: forming a buffer layer 2.

Specifically, a plasma-enhanced chemical vapor deposition (PECVD) method may be used to deposit a buffer layer 2 with a thickness of 500 to 5000 Å on the substrate after step 1. The buffer layer 2 may adopt oxides, nitrides or oxynitride compounds, and the corresponding reaction gas is $SiH_4$, $NH_3$, $N_2$ or $SiH_2Cl_2$, $NH_3$, $N_2$.

Step 3 includes: forming an active layer 3.

Specifically, a layer of semiconductor material is deposited on the substrate after step 2, a layer of photoresist is coated on the semiconductor material, and the photoresist is exposed by using a mask to form a photoresist unreserved region and a photoresist completely reserved region. The photoresist completely reserved region corresponds to the region where the pattern of the active layer is located. Developing is performed, the photoresist in the photoresist unreserved region is completely removed, and the thickness of the photoresist in the photoresist completely reserved region remains unchanged. The semiconductor material in the photoresist unreserved region is completely etched by an etching process, to form the pattern of the active layer 3.

Step 4 includes: forming a gate insulating layer 4.

Specifically, a plasma-enhanced chemical vapor deposition method may be used to deposit a gate insulating layer with a thickness of 500 to 5000 Å on the substrate after step 3, the gate insulating layer may adopts oxides, nitrides or oxynitride compounds, and the corresponding reaction gas is $SiH_4$, $NH_3$, $N_2$ or $SiH_2Cl_2$, $NH_3$, $N_2$. A layer of photoresist is coated on the gate insulating layer, and a mask is used to expose the photoresist to form a photoresist unreserved region and a photoresist completely reserved region. The photoresist completely reserved region corresponds to the region where the pattern of the gate insulating layer is located. Developing is performed, the photoresist in the photoresist unreserved region is completely removed, and the thickness of the photoresist in the photoresist completely reserved region remains unchanged. The gate insulating layer in the photoresist unreserved region is completely etched through an etching process, to form the pattern of the gate insulating layer 4.

Step 5 includes: forming a gate electrode 5.

Specifically, sputtering or thermal evaporation may be used to deposit a gate metal layer with a thickness of about 500 to 4000 Å on the substrate after step 4. The gate metal layer may be Cu, Al, Ag, Mo, Cr, Nd, Ni, Mn, Ti, Ta, W or other metals, or alloys of these metals, and the gate metal layer may be a single-layer structure or a multi-layer structure, the multi-layer structure may be Cu\Mo, Ti\Cu\Ti, Mo\Al\Mo, etc. A layer of photoresist is coated on the gate metal layer, and a mask is used to expose the photoresist to form a photoresist unreserved region and a photoresist reserved region. The photoresist reserved region corresponds to the region where the pattern of the gate electrode 5 is located, and the photoresist unreserved photoresist region corresponds to the region other than the above pattern. Developing is performed, the photoresist in the photoresist unreserved region is completely removed, and the thickness of the photoresist in the photoresist reserved region remains unchanged. The gate metal film in the photoresist unreserved region is completely etched by etching process, and the remaining photoresist is stripped, to form the pattern of the gate electrode 5.

Step 6 includes: forming an interlayer insulating layer 15.

Specifically, a plasma-enhanced chemical vapor deposition method may be used to deposit an interlayer insulating layer with a thickness of 500 to 5000 Å on the substrate after step 5. The interlayer insulating layer may adopts oxides, nitrides or oxynitride compounds, and the corresponding reaction gas is $SiH_4$, $NH_3$, $N_2$ or $SiH_2Cl_2$, $NH_3$, $N_2$.

Step 7 includes: forming a drain electrode 6 and a source electrode 7.

Specifically, magnetron sputtering, thermal evaporation, or other film forming methods may be used to deposit a source-drain metal layer with a thickness of about 2000 to 4000 Å on the substrate after step 6. The source-drain metal layer may be Cu, Al, Ag, Mo, Cr, Nd, Ni, Mn, Ti, Ta, W or other metals, or alloys of these metals. The source-drain metal layer may be a single-layer structure or a multi-layer structure, where the multi-layer structure may be Cu\Mo, Ti\Cu\Ti, Mo\Al\Mo, etc. A layer of photoresist is coated on the source-drain metal layer, and a mask is used to expose the photoresist to form a photoresist unreserved region and a photoresist reserved region. The photoresist reserved region corresponds to the region where the pattern of the drain electrode 6 and the source electrode 7 is located, and the photoresist unreserved region corresponds to the region except the above pattern. Developing is performed, the photoresist in the photoresist unreserved region is completely removed, and the thickness of the photoresist in the photoresist reserved region remains unchanged. The source-drain metal layer in the photoresist unreserved region is completely etched by the etching process, and the remaining photoresist is stripped, to form the drain electrode 6 and the source electrode 7.

Step 8 includes: forming a color filter layer 8.

The color filter layer 8 can convert white light emitted from the white OLED display unit into monochromatic light.

Step 9 includes: forming a passivation layer 9.

Specifically, magnetron sputtering, thermal evaporation, PECVD or other film forming methods may be used to deposit the passivation layer 9 with a thickness of 2000 to 1000 Å on the substrate after step 8. The passivation layer may adopt oxides, nitrides or oxynitride compounds, specifically, material of the passivation layer may be SiNx, SiOx or Si(ON)x, or the passivation layer may use $Al_2O_3$. The passivation layer may be a single-layer structure or a two-layer structure formed by silicon nitride and silicon oxide. The reaction gas corresponding to silicon oxide may be $SiH_4$, or $N_2O$; the corresponding gas of nitride or oxynitride compound may be $SiH_4$, $NH_3$, $N_2$ or $SiH_2Cl_2$, $NH_3$, $N_2$.

Step 10 includes: forming an optical adjustment structure 10.

Some regions on the left and right sides of the pixel region are provided with the optical adjustment structure 10 for adjustment. The optical adjustment structure 10 can absorb light with a specific wavelength or convert light with a specific wavelength into light with another wavelength.

Since relatively obvious color shift merely occurs at side view angles and the optical adjustment structure may have a certain impact on the light emitting efficiency of the display substrate, the optical adjustment structure may not be provided for the central region of the white OLED display unit and the optical adjustment structure may only be provided for the edge region of the white OLED display unit, which can not only solve the color shift problem existing at the side view angle, but also will not cause much influence on the light emitting efficiency of the display substrate.

Figure 2:
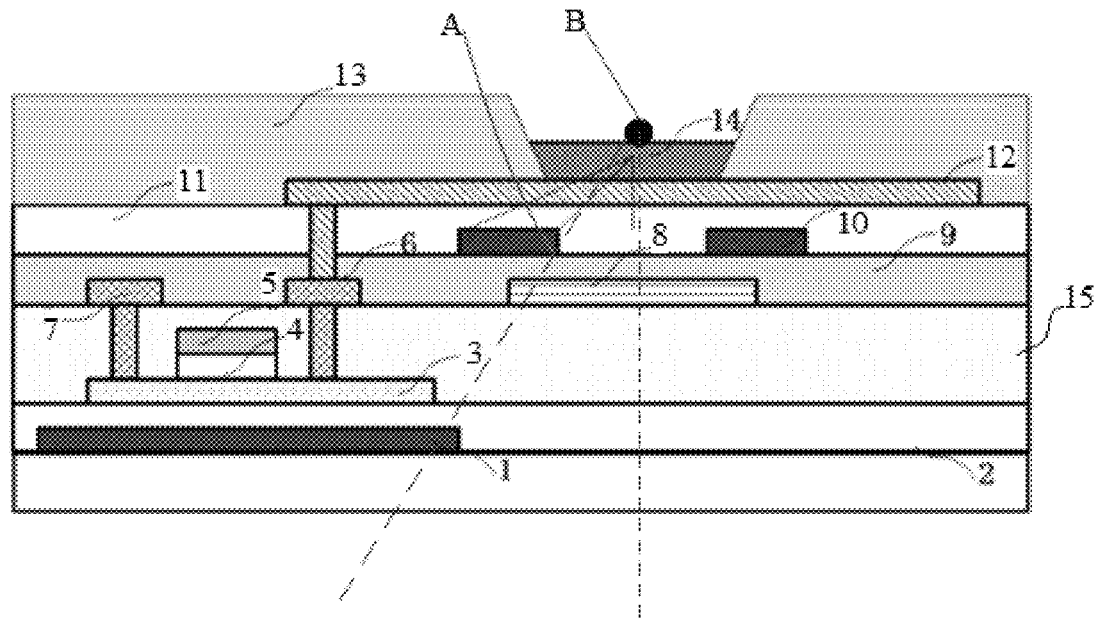
FIG. 2 is a schematic diagram of a view angle according to some embodiments of the disclosure.
Figure 3:
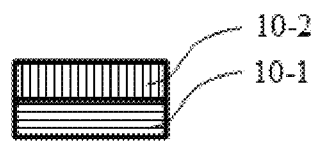
FIG. 3 is a schematic diagram of an optical adjustment structure according to some embodiments of the disclosure.

Specifically, as shown in FIG. 2, the angle θ, between a line connecting an edge of the optical adjustment structure 10 closer to the center of the white OLED display unit 14 and the center of the white OLED display unit 14 and a normal line perpendicular to the base substrate, may be greater than 45°.

When the view angle is greater than 45°, the rate of decrease of the intensity of the green light band is significantly less than the rate of decrease of the intensity of the red and blue light bands. Therefore, the display screen seen at the side view angle is greenish. In some specific embodiments, the optical adjustment structure 10 is formed by a red filter layer 10-1 and a blue filter layer 10-2 that are stacked, so that the optical adjustment structure 10 can absorb green light.

Step 11 includes: forming an auxiliary structure 11 covering the optical adjustment structure 10.

The auxiliary structure 11 may be made of transparent resin with a thickness of 1 to 3.5 microns, which can provide a flat surface for subsequent processes.

Step 12 includes: forming an anode 12.

Specifically, a transparent conductive layer with a thickness of about 300 to 1500 Å is deposited on the substrate after step 11 through sputtering or thermal evaporation. The transparent conductive layer may be ITO, IZO or other transparent metal oxides. A layer of photoresist is coated on the layer, and a mask is used to expose the photoresist to form a photoresist unreserved region and a photoresist reserved region. The photoresist reserved region corresponds to the region where the pattern of the anode 12 is located, the photoresist unreserved region corresponds to the region except the above pattern. Developing is performed, the photoresist in the photoresist unreserved region is completely removed, and the thickness of the photoresist in the photoresist reserved region remains unchanged. The film of the transparent conductive layer in the photoresist unreserved region is completely etched through etching process, and the remaining photoresist is stripped, to form the pattern of the anode 12.

Step 13 includes: forming a pixel defining layer 13.

Step 14 includes: forming a white OLED display unit 14 in the pixel region defined by the pixel defining layer 13.

The white OLED display unit 14 may include a hole injection layer (HIL), a hole transport layer (HTL), a light emitting layer (EML), an electron transport layer (ETL), etc.

After the above steps 1 to 14, the display substrate shown in FIG. 1 can be obtained. The display substrate includes the optical adjustment structure located on the light emitting side of the white OLED display unit, the optical adjustment structure is arranged in the peripheral region of each pixel region, and the optical adjustment structure can absorb light having a specific wavelength or convert light having a specific wavelength into light having another wavelength. In this way, when color shift of a specific wavelength occurs at a side view angle, the optical adjustment structure can absorb light having the specific wavelength or convert light having the specific wavelength into light having another wavelength, thereby improving color shift of the display device at the side view angle and improving the display effect of the display device.

Table 2 shows color coordinates (CIEx, CIEy) and color shift coefficients (Δu'v') of the OLED display substrate according to the embodiments of the disclosure at different view angles. It can be seen that the color shift has been improved.

TABLE 2

| | W" | | |
|---|---|---|---|
| View angle | CIEx | CIEy | Δu'v' |
| 0 | 0.320 | 0.307 | — |
| 15 | 0.321 | 0.314 | 0.004 |
| 30 | 0.323 | 0.336 | 0.019 |
| 45 | 0.322 | 0.336 | 0.019 |
| 60 | 0.323 | 0.366 | 0.037 |

In the method embodiments of the present disclosure, sequence numbers of various steps are not used to limit the order of the steps. For those of ordinary skill in the art, change of the order of the steps without any creative efforts also falls within the protection scope of the present disclosure.

Unless otherwise defined, technical terms or scientific terms used in the present disclosure shall have common meanings understood by those ordinary skilled in the art. Terms such as "first" and "second" in the present disclosure do not indicate any order, quantity or importance, and they are merely used to distinguish different components. Terms such as "include" or "have" indicate that an element or object before such terms covers an element, an object or the equivalent enumerated after such terms, and do not exclude other elements and objects. Terms such as "coupled" and "connected" are not limited to physical or mechanical connection, they may include direct or indirect electrical connection. Terms such as "above", "below", "left" and "right" are merely to describe relative position relationships, and if an absolute position of a described object changes, relative positions with respect to the described object may change correspondingly.

It can be understood that, if an element such as a layer, a film, a region or a substrate is described to be on or below another element, the element may be directly on or below the another element, or there may be an intermediate element between the element and the another element.

The above descriptions merely illustrate some embodiments of the present disclosure. It should be noted that a person skilled in the art can make various improvements and polishments without departing from the principles of the present disclosure, and these improvements and polishments shall fall within the protection scope of the present disclosure.

What is claimed is:

1. A display substrate, comprising:
a base substrate;
a white organic light-emitting diode (OLED) display unit on the base substrate; and
an optical adjustment structure on a light emitting side of the white OLED display unit, wherein the optical adjustment structure is in a peripheral region of each pixel region, and the optical adjustment structure is configured to absorb light in a first wavelength range or convert light in a first wavelength range into light in a second wavelength range;
wherein an angle, between a line connecting a first peripheral point of the optical adjustment structure and a center of the white OLED display unit and a normal line perpendicular to the base substrate, is greater than a threshold, the threshold ranges from 45 degrees to 60 degrees, the first peripheral point is the point closest to the center of the white OLED display unit on the optical adjustment structure;
in a direction where the center of the white OLED display unit faces the optical adjustment structure, an intensity decrease rate of the light in the first wavelength range is smaller than that of the light in the second wavelength range.

2. The display substrate according to claim 1, wherein the pixel region further comprises a central region, the peripheral region surrounds the central region, and the optical adjustment structure is symmetrical with respect to the central region.

3. The display substrate according to claim 2, further comprising: an auxiliary structure in a same layer as the optical adjustment structure, wherein the auxiliary structure and the optical adjustment structure form a flat layer.

4. The display substrate according to claim 2, further comprising: an auxiliary structure covering the optical adjustment structure, wherein the auxiliary structure has a flat surface.

5. The display substrate according to claim 1, further comprising: an auxiliary structure in a same layer as the optical adjustment structure, wherein the auxiliary structure and the optical adjustment structure form a flat layer.

6. The display substrate according to claim 5, wherein the auxiliary structure is made of a light-transmissive material.

7. The display substrate according to claim 1, further comprising: an auxiliary structure covering the optical adjustment structure, wherein the auxiliary structure has a flat surface.

8. The display substrate according to claim 1, wherein the optical adjustment structure is configured to absorb green light, or, convert green light into red light or blue light.

9. The display substrate according to claim 8, wherein the optical adjustment structure comprises a red filter layer and a blue filter layer that are stacked.

10. The display substrate according to claim 1, wherein the optical adjustment structure comprises at least one of: a photonic crystal, a color conversion structure, or a filter structure.

11. A display device, comprising the display substrate according to claim 1.

12. A method for manufacturing a display substrate, comprising: forming an optical adjustment structure on a light emitting side of a white OLED display unit, wherein the optical adjustment structure is in a peripheral region of each pixel region, and the optical adjustment structure is configured to absorb light in a first wavelength range or convert light in a first wavelength range into light in a second wavelength range;
wherein an angle, between a line connecting a first peripheral point of the optical adjustment structure and a center of the white OLED display unit and a normal line perpendicular to the base substrate, is greater than a threshold, the threshold ranges from 45 degrees to 60 degrees, the first peripheral point is the point closest to the center of the white OLED display unit on the optical adjustment structure;
in a direction where the center of the white OLED display unit faces the optical adjustment structure, an intensity decrease rate of the light in the first wavelength range is smaller than that of the light in the second wavelength range.

13. The method for manufacturing the display substrate according to claim 12, wherein the optical adjustment structure is symmetrical with respect to a central region of the pixel region, and the peripheral region of the pixel region surrounds the central region.

14. The method for manufacturing the display substrate according to claim 12, further comprising: forming an auxiliary structure in a same layer as the optical adjustment structure, wherein the auxiliary structure and the optical adjustment structure form a flat layer.

15. The method for manufacturing the display substrate according to claim 14, wherein the forming the auxiliary structure comprises forming the auxiliary structure with a light-transmissive material.

16. The method for manufacturing the display substrate according to claim 12, further comprising: forming an auxiliary structure covering the optical adjustment structure, wherein the auxiliary structure has a flat surface.

17. The method for manufacturing the display substrate according to claim 12, wherein the forming the optical adjustment structure comprises: forming a red filter layer and a blue filter layer that are stacked.

18. The method for manufacturing the display substrate according to claim 12, wherein before the forming the optical adjustment structure, the method further comprises: providing a base substrate, wherein the white OLED display unit is arranged on the base substrate.

* * * * *